United States Patent
Ashdown

(10) Patent No.: US 6,177,632 B1
(45) Date of Patent: Jan. 23, 2001

(54) METAL CASE FOR CIRCUIT BOARD FOR HORIZONTAL OR VERTICAL MOUNTING

(75) Inventor: Glynn Russell Ashdown, Lake Bluff, IL (US)

(73) Assignee: Texas Instruments Incorporated, Dallas, TX (US)

( * ) Notice: Under 35 U.S.C. 154(b), the term of this patent shall be extended for 0 days.

(21) Appl. No.: 09/183,612

(22) Filed: Oct. 30, 1998

(51) Int. Cl.⁷ ................................. H02G 3/08; H05K 5/00
(52) U.S. Cl. .................... 174/52.1; 361/752; 361/720
(58) Field of Search .................... 174/52.1, 35 R, 174/35 MS; 361/816, 818, 752, 753, 720, 800; 257/699, 708

(56) References Cited

U.S. PATENT DOCUMENTS 4,152,671 * 5/1979 Tuma et al. ........................... 331/68
5,557,063 * 9/1996 Mottahed ........................ 174/35 GC

* cited by examiner

Primary Examiner—Kristine Kincaid
Assistant Examiner—Hung V Ngo
(74) Attorney, Agent, or Firm—W. Daniel Swayze, Jr.; Wade James Brady, III; Frederick J. Telecky, Jr.

(57) ABSTRACT

A case for an auxiliary circuit board to be mounted on a main circuit board includes a copper sheet formed into a U-shape in which the auxiliary circuit board is mounted. Mounting pins extend from two edges of the case for positioning the auxiliary circuit board perpendicularly to or parallel to the main circuit board. Mounting pins for through hole mounting and support tabs for surface mounting are provided, the unneeded features being removed prior to use of the case.

10 Claims, 2 Drawing Sheets

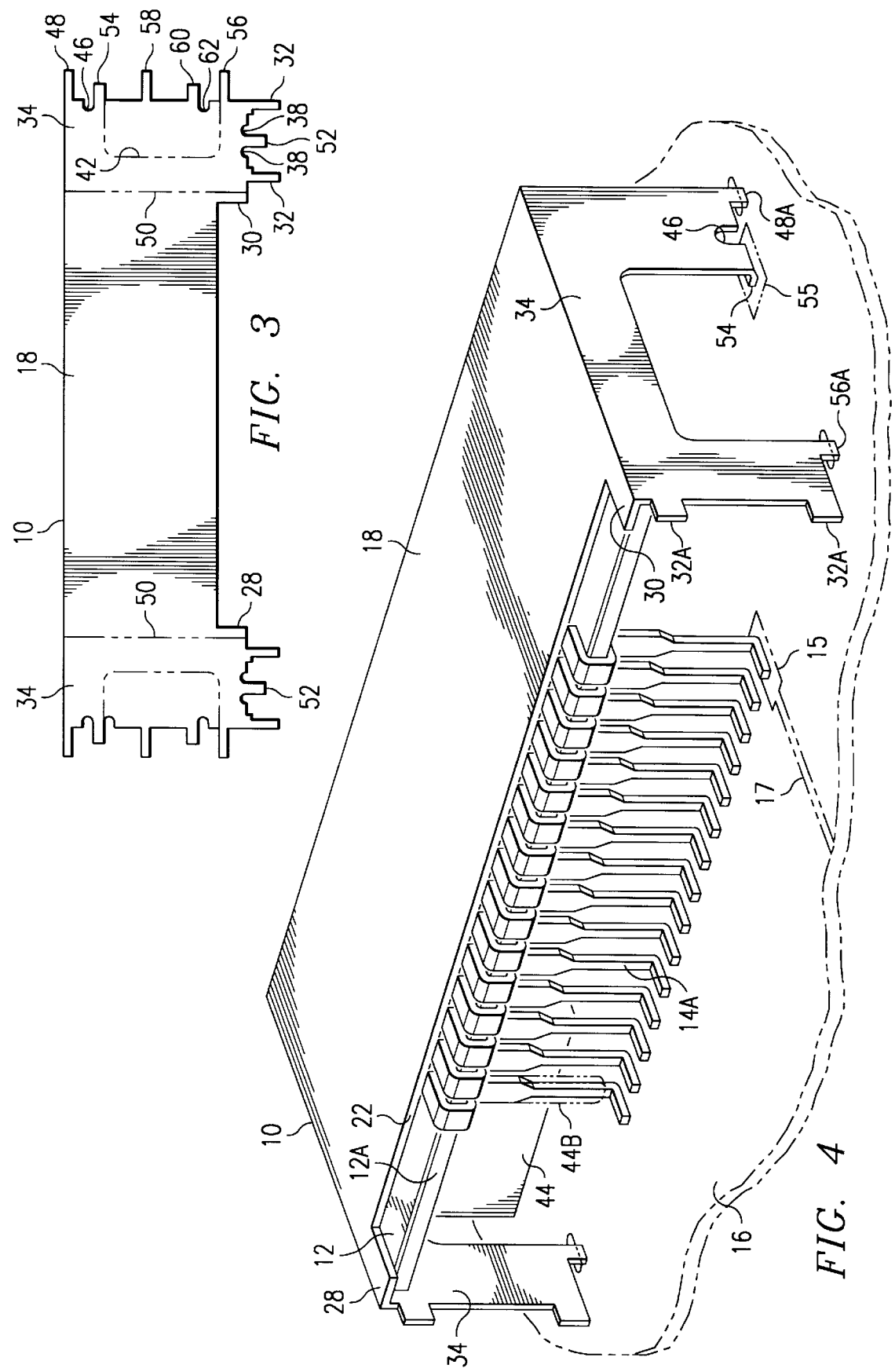

METAL CASE FOR CIRCUIT BOARD FOR HORIZONTAL OR VERTICAL MOUNTING

BACKGROUND OF THE INVENTION

1. Field of the Invention

The present invention relates generally to a versatile metal case for a circuit board which dissipates heat and aids in mounting the circuit board to another surface, such as another circuit board, in either a horizontal or a vertical configuration.

2. Description of the Related Art

Electrical devices which have circuitry provided on a circuit board are increasingly utilizing sub-circuits mounted on small circuit boards, or daughter boards, which then must be connected electrically and physically to the main circuit, or motherboards. A power supply for the circuit is an example of a sub-circuit that is commonly found on a separate circuit board. Power supplies generate heat generally to a greater extent than the rest of the circuit so cooling the power supply sub-circuit presents an additional problem.

SUMMARY OF THE INVENTION

An object of the present invention is to provide a simple and inexpensive case for physically and electrically connecting a circuit board containing a sub-circuit to another circuit board. Another object of the invention is to provide a case for a circuit board which aids in dissipation of the heat generated by the circuit on the circuit board. Yet a further object of the invention is to provide a case for circuit board of a single design which may be mounted as a surface mounted component or as a through pin mounted component in either a vertical or horizontal position.

These and other objects and advantages of the invention are provided by a circuit board case having a back panel with a top edge, a bottom edge, and two side edges. Side panels are provided connected to the edges of the back panel. Each of the side panels is provided with a top edge, a bottom edge, and a free side edge opposite the edge connected to the back panel. The bottom edges of the side panels are shaped to provide pins and tabs for mounting the case in a vertical configuration. The free edges of the side panels are provided with pins and support tabs for mounting the case in a horizontal configuration. A circuit board is mounted in the case preferably with the back plane of the circuit board lying against the back panel of the case. The lower edge of the circuit board is mounted at the bottom edge of the case and edge contacts are provided on the lower edge of the circuit board. Connector pins are mounted on the edge contacts. The pins are capable of electrically connecting the circuit of the circuit board in the case to another circuit when the case is mounted in either the vertical or horizontal mounting position. The bottom edge of the back panel of the case is provided with a cut away which is clear of the pins on the edge connector of the circuit board so as to prevent short circuiting of the pins.

To ensure proper mounting of the case on a motherboard, shoulders are provided on the present case for abutting the surface of the motherboard in either a through pin mounting or a surface mounting arrangement. The shoulders and through pins are provided in either the horizontal or vertical mounting configuration.

The circuit board case of the present invention including the back panel and side panels as well as the support shoulders and mounting pins are all formed from a single sheet of thermally conductive material which is then cut and bent into the configuration of the present circuit board case.

The present case provides small shoulders to achieve a minimal contact area on the main circuit board so that tracks, or leads, on the main circuit board are not shorted and so that circuit elements on the main circuit board may be positioned inside the U-shaped case in the vertical mounting or under the case in the parallel mounting position.

BRIEF DESCRIPTION OF THE DRAWINGS

FIG. 3 is a plan view of a blank for forming the present circuit board case;

FIG. 4 is a perspective view of the present circuit board case for horizontal mounting.

DETAILED DESCRIPTION OF THE PREFERRED EMBODIMENTS

Figure 1:
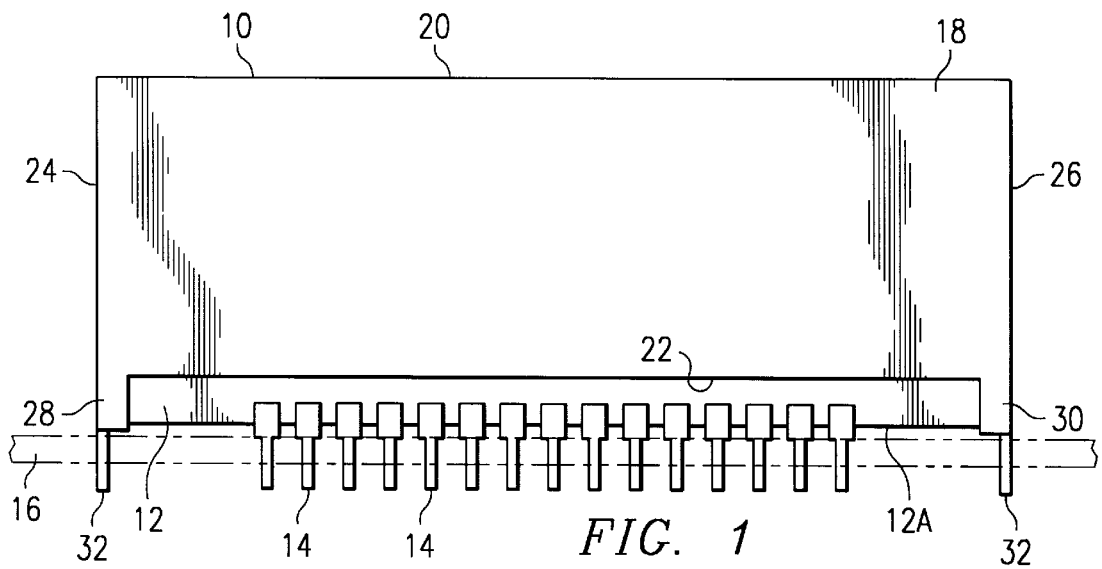
FIG. 1 is a front elevational view of the case according to the present invention.

In FIG. 1 is shown a back view of an auxiliary circuit board case 10 according to the present invention. The case 10 is mounted to an auxiliary circuit board 12 which has a connector edge 12A to which is connected electrical connection pins 14. Electrical circuitry on the auxiliary circuit board 12 is connected through the electrical connector pins 14 to a main circuit such as on a main circuit board 16. In the view of FIG. 1, the auxiliary circuit board 12 is extending perpendicularly from the main circuit board 16. As will be described here and after, it is also possible to mount the auxiliary circuit board 12 parallel to the main circuit board 16.

The case 10 has a first planar portion 18 which is mounted to the back of the auxiliary circuit board. The first planar portion 18 is generally rectangular including a top edge 20 a bottom edge 22 and side edges 24 and 26. The bottom edge 22 is cut out to provide clearance for the electrical connector pins 14. Reinforcing corners 28 and 30 are at the sides 24 and 26, respectively, and extend to near the surface of the main circuit board 16 without contacting the main circuit board. The reinforcing corners 28 and 30 may serve as crush resistance by abutting against the main circuit board 16 when downward pressure is applied to the case 10. Mounting pins 32 extend through openings in the main circuit board 16 to mount the case 10 and accurately position the case 10 on the main circuit board. Similarly, the electrical connector pins 14 extend through openings in the main circuit board 16. The mounting pins 32 are preferably soldered in place in the main circuit board 16, which is performed at the same time that the electrical connection pins 14 are soldered. Thus, mounting of the present case and electrically connecting the circuit held therein is accomplished in a single soldering step. The mounting pins 32 may be tinned or otherwise wetted to promote adhesion of the solder. In one embodiment, the entire case 10 is tinned, thereby avoiding the necessity of selective tinning of only the mounting pins. FIG. 1, thus, illustrates the through pin mounting configuration of the present case 10 in the vertical orientation.

Figure 2:
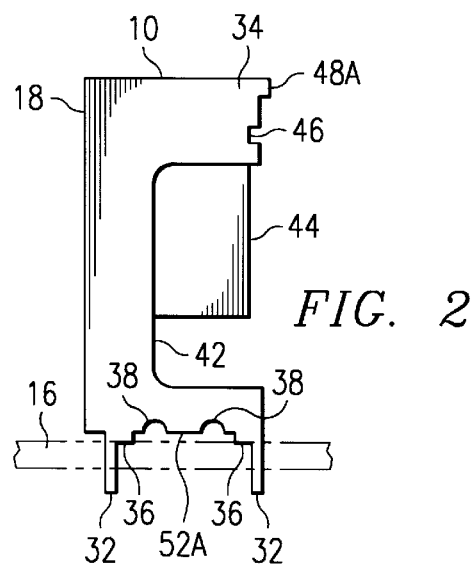
FIG. 2 is a side elevational view of the case of FIG. 1.

FIG. 2 shows the case 10 of FIG. 1 from a side view. In the view of FIG. 2, a side panel 34 of the case is seen from which extends the mounting pins 32. As noted before, the mounting pins 32 extend through openings in the main circuit board 16. Two such mounting pins 32 are provided at the opposite ends of the bottom edge of the side panel 34.

Also formed in the bottom edge of the side panel 34 adjacent the mounting pins 32 are shoulders 36 which define the mounting plane of the case 10 in the vertical orientation. The shoulders 36 of the illustrated embodiment lie immediately adjacent the mounting pins 32. Between the shoulders are a pair of optional relief cut outs 38 between which is a portion 52A remaining from an optional support tab 52 which has been cut off. The support tab 52 is left on when used for surface mounting the case and may be left on for through hole mounting. It may also be left on in through hole mounting as an additional adhesion surface. The relief cut outs 38 are semi-circular in shape and are on either side of the support tab portion 52.

The side panel 34 is joined to the back 18 at one edge of the side panel (the left side of FIG. 2). At the opposite edge of the side panel (the right side of FIG. 2), is provided a cut out 42 through which is visible a circuit component 44 that is mounted on the auxiliary circuit board 12. For example, the component 44 is a choke coil for a power supply in the illustrated embodiment and is the largest component on the auxiliary circuit board 12. Other components and circuits are of course covered as well. Also on that opposite side is provided a relief cut out 46 and a residual portion 48A of a mounting pin. The residual portion 48A of the mounting pin is left after a mounting pin for horizontal mounting of the present case is removed, such as by cutting.

The present case has an overall configuration of a U-shape with the back panel 18 and two side panels 34 defining the "U." When originally formed, the present case is a planar plate or sheet of material which is cut or punched and which is then bent to form the present case. An example of the flat blank from which the present case is formed is shown in FIG. 3. The case is preferably formed of copper or other good heat conducting material by being cut from a sheet of the material. After being cut in the illustrated shape, unneeded mounting pins may be trimmed from the blank, support tabs are bent or trimmed off as necessary, side cut outs are removed if desired, and the blank is folded along the two fold lines 50. In particular, the blank has the back portion 18 with the cut out at the lower edge 22 and the reinforcing corners or shoulders 28 and 30. On the end panel 34 is provided the mounting pins 32, the optional relief cut outs 38 and an optional support tab 52. When mounted in a through hole configuration as shown in FIGS. 1 and 2, the pins 32 are left in place and the support tab 52 may be bent at 90 degrees or may be cut off to leave the remainder 52A. The present case may also be surfaced mounted, in which case the optional support tab 52 is bent at a right angle and then soldered or otherwise adhesively mounted to the surface of the main circuit board 16. In this configuration, the pins 32 remain as insertion guides into the main circuit board 16. As an aid in alignment of the case on the main circuit board 16 during surface mounting, a residual portion of the mounting pins 32 may be left when removing the pins. The relief cut outs 38 reduce metal stress created during the bending of the support tab 52.

The detailed features of FIG. 3 have been described with respect to the right-hand side of the Figure. The same features are present as a mirror image on the left-hand side of the Figure as well.

Referring now to FIG. 4, the case 10 may be mounted with the auxiliary circuit board 12 and the back panel 18 positioned parallel to the main circuit board 16. The space below the circuit board 12 may accommodate circuit elements on the main circuit board 16. Large components like the choke coil 44 may restrict a portion of the space available under the case 10. In the illustration of FIG. 4, the case 10 is configured for surface mounting. In particular, electrical connector pins 14A extend from the auxiliary circuit board 12 perpendicularly to the surface of the main circuit board 16 where they are bent at a right angle for surface connection. In the embodiment for parallel mounting, the electrical connector pins 14A extend over a greater distance before connecting to the circuitry of the main circuit board 16, which may lead to higher inductance and higher resistance compared to the shorter connection through the pins shown in FIG. 1. The inductance and resistance values are reduced by extending the thickened shoulder portion 14B of the pins 14A to nearer the surface of the main circuit board 16 as indicated by dotted outline.

Surface mounting of the case 10 is accomplished by a support tab 54 which is bent at a right angle to the side panel 34 and on which the case 10 rests on the main circuit board 16. The relief cut out 46 is seen adjacent the support tab 54 on one side thereof and the cut out 42 is on the other side. Residual parts 48A and 56A of mounting pins are present to fit into depressions or holes, indicated by dotted outline, in the main circuit board 16 for aid in alignment of the case into proper position. Alignment is important since the support tab 54 must be positioned on a solder pad 55 and the electrical connector pins 14A must be positioned on respective solder pads 15 on the main circuit board 16. The solder pads 15 connect to tracks 17 which form the printed circuit on the main circuit board 16.

The maximum co-planarity is achieved by the present case 10 since the mounting shown in FIG. 4 rests on the electrical connector pins 14A and on the support tabs 52 on each side panel. A three legged mounting is effectively achieved.

As can be seen in FIG. 4, the mounting pins 32 have been cut off to leave residual parts 32A. These may be completely removed as desired or the mounting pins 32 may be left on the case 10 to eliminate the pin removal step. The embodiment of FIG. 4 differs from that shown in FIGS. 1–3 in that the support tab 52 and relief cut outs 38 are not present. These features may be included or not as desired.

Referring back to FIG. 3, the support tab 54 is shown prior to being bent into the shape shown in FIG. 4. The support pins 48 and 56 are shown prior to being cut off.

Also in FIG. 3, the cut out 42 is shown prior to being removed. Included in the portion which would be removed to form the cut out 42 is a further mounting pin 58 and a further support tab 60 with its relief cut out 62. This portion may be left in place to provide multiple mounting locations for the case 10 as desired.

Figure 5:
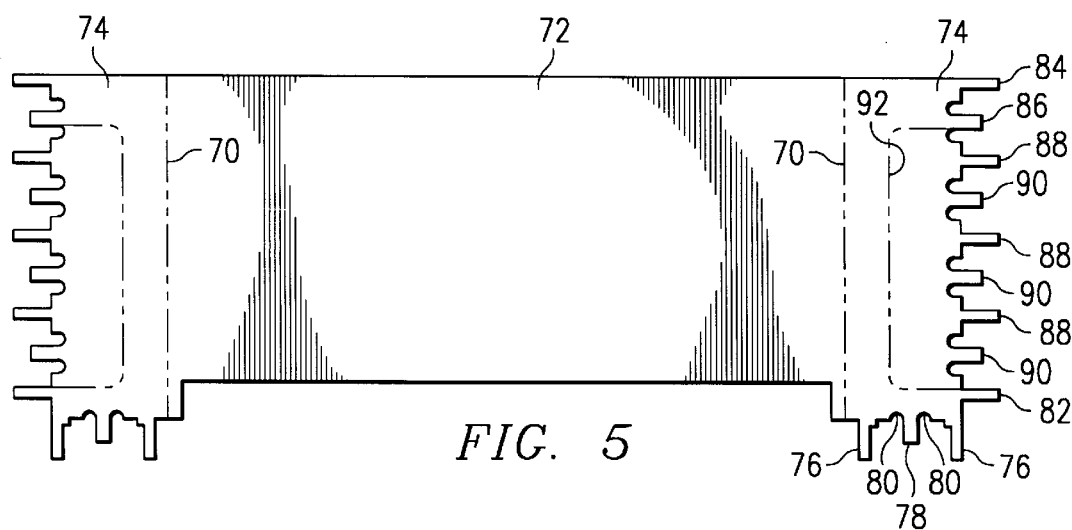
FIG. 5 is a plan view of a blank for forming a second embodiment of the present circuit board case.

A further embodiment is shown in FIG. 5 for taller auxiliary circuit boards. In the embodiment of FIG. 5, fold lines 70 divide a back portion 72 from side panels 74. The side panels have at their lower edge two mounting pins 76 between which is a support tab 78 and relief cut outs 80, the same as in the embodiment of FIG. 3. The difference, however, lies in the lateral sides of the end panels 74. In addition to the corner mounting pins 82 and 84 and a support tab 86, the present embodiment provides three additional mounting pins 88 and three additional mounting tabs 90 with their associated relief cut outs. Use of the additional mounting pins and tabs provides stronger attachment to the main circuit board to resist high G shock and provides greater thermal transfer to the main circuit board as well. These additional mounting pins 88 and support tabs 90 may be removed by cutting out the portion of the side panel at line 92. The left side of the Figure has the same features as described for the right side, but in mirror image.

The embodiments of the invention described hereinabove may be mounted in a variety of ways. Four possible mounting styles are possible with a single case and are described hereinafter.

In operation, the present case may be mounted for a through pin mounting in a vertical orientation as shown in FIGS. 1 and 2 with the mounting pins 32 extending through openings in the main circuit board 16 until shoulders 36 contact the surface of the main circuit board 16. The shoulders 36 lift the rest of the lower edge of the case 10 above the surface of the main circuit board 16 to avoid contact with tracks and so prevent shorting of the circuitry on the main circuit board. The mounting pins 32 are soldered in place as is common in through pin mounting of circuit components. Such soldering is performed at the same time as the soldering of the electrical connection pins 14.

Alternately, the present case may be surface mounted in a vertical orientation by bending the support tabs 52 at a right angle and removing the mounting pins 32 so that the support tabs 52 are soldered onto or otherwise adhesively mounted to the main circuit board. Portions 32A of the mounting pins 32 may remain for assistance in proper positioning of the case 10. In the surface mounting configuration, the electrical connector pins 14 are bent to lie against the upper surface of the main circuit board 16 as is common in surface mounted applications. The alignment aid provided by the portions 32A assures that the support tabs 52 and the electrical connector pins 14 are aligned over their respective solder pads on the main circuit board 16.

Another alternative use for the present case is the horizontal, or parallel, mounting of the auxiliary circuit board 12 to the main circuit board 16. This can be by through hole mounting by leaving the mounting pins 56 and 58 intact on the sides of the end panels so that the mounting pins 56 and 58 extend through holes, or bores, in the main circuit board 16. The additional mounting pin 58 may also be left in place for greater security in the mounting of the case. In such a through hole mounting arrangement, the support tabs 54 and 60 may be soldered as additional contact support or may be removed. Thermal conductivity to the main circuit board 16 is increased by the additional mounting pins 58 and support tabs 54 and 60 for added cooling.

As yet a further alternative, the present case may surface mount the auxiliary circuit board in parallel to the main circuit board 16, as shown in FIG. 4, wherein the mounting pins 48 and 56 are removed entirely or only residual portions 48A and 56A thereof remain and the support tabs 54 and potentially 60 are bent to form surface mounting pads for the case.

It is to be noted that the mounting tabs for surface mounting are positioned slightly lower toward the mounting plane than shoulder portions at the edge of the case so that the shoulder portions serve as a strain relief for downward pressure on the case. In a preferred embodiment, ten thousandths of an inch distance is provided between the mounting plane for the support tab and the shoulders to provide crush resistance.

The present case is preferably punched from a plate of thermally conductive material, such as copper, to provide thermal conduction of heat away from the auxiliary circuit board and dissipation into the air flow into which the case extends and to the main circuit board 16. For parallel mounting, the further mounting pins or mounting tabs between the opposite corner pins provides additional thermal connections between the main circuit board and the auxiliary circuit board if needed. When the cut outs 42 or 92 are removed, it provides an air flow passage to components on the circuit board and potentially an additional escape route for water during post-soldering cleaning of the soldered connections. The cut out at the edge 22 of the back panel 18 is provided to prevent shorting between the electrical connector pins 14.

Preferably, the blanks are cut in the shape illustrated in either FIG. 3 or FIG. 5 and additional cut outs are made and unwanted pins and support tabs removed by post punching to remove unnecessary or unwanted projections from the case. Some installations of the present case 10 may permit the unused pins to remain.

Thus, there is shown and described a case for an auxiliary circuit board which allows mounting of the board into two orientations and at two mounting types which utilizes a minimum of material and provides a maximum of co-planarity for the mounting of the auxiliary board.

An alternate configuration is contemplated wherein case is mounted in the parallel configuration as shown in FIG. 4 or in the vertical, or perpendicular configuration. A second auxiliary circuit board is positioned parallel to the first auxiliary circuit board 12. The second auxiliary circuit board is on the opposite side of the first auxiliary circuit board from the back panel of the case and is within the side panels. Support for the second auxiliary circuit board is provided by the electrical connection pins from the first auxiliary circuit board extending through openings in the second auxiliary circuit board, where a solder connection is made, and then to the main circuit board. The electrical connection pins for the second auxiliary circuit board extend from an opposite edge of the second auxiliary circuit board than the electrical pins of the first auxiliary circuit board and extend to the first auxiliary circuit board. One edge of the first auxiliary board extends from the case to permit the pins from the second board to pass through the first board without contacting the case. The second board is thus suspended below the first board by the electrical pins on the two opposite sides. As yet a further embodiment, the electrical pins may extend from opposite edges of the first board and pass through the second board to suspend it and electrically connect to it. Greater circuit density is thereby achieved.

It is anticipated to provide a heat sink mounted on the case for additional cooling capacity. For example, the heat sink may be mounted on the back panel opposite the auxiliary circuit board.

Although other modifications and changes may be suggested by those skilled in the art, it is the intention of the inventors to embody within the patent warranted hereon all changes and modifications as reasonably and properly come within the scope of their contribution to the art.

I claim:

1. A circuit board assembly, comprising:
   an auxiliary circuit board having mounted thereon circuit elements and having a connector edge, said auxiliary circuit board having a major surface defining a back;
   a plurality of electrical connector pins mounted extending from said connector edge; a case having:
      a first planar portion mounted to said back of said auxiliary circuit board, said first planar portion being generally rectangular and having first and second sides disposed generally perpendicular to said connector edge of said auxiliary circuit board,
      a second planar portion extending generally perpendicular to said first planar portion from said first side of said first planar portion, and
      a third planar portion extending generally perpendicular to said first planar portion from said second side of said first planar portion; and mounting pins extending from at least one edge of each of said second planar portion and said third planar portion, said case and said mounting pins being formed from a single sheet of thermally conductive material so as to be integrally connected.

2. A circuit board assembly as claimed in claim 1, wherein said second and third planar portions each include mounting pins extending from two edges for mounting said case alternately in two positions.

3. A circuit board assembly as claimed in claim 1, further comprising:

support tabs formed on said at least one edge as said mounting pins.

4. A circuit board assembly as claimed in claim 1, wherein said second and third planar portions are each generally rectangular;

said mounting pins extend perpendicularly from two edges of said second planar portion and perpendicularly from two edges of said third planar portion, said mounting pins lying co-planar with respective ones of said second and third planar portions from which they extend.

5. A circuit board assembly as claimed in claim 4, further comprising:

support tabs and abutment shoulders on said second and third planar portions.

6. A circuit board assembly as claimed in claim 5, wherein said support tabs include portions bent generally perpendicular to respective ones of said second and third planar portions.

7. A circuit board assembly as claimed in claim 5, wherein said second and third planar portions define relief cutouts adjacent said support tabs.

8. A case for an auxiliary circuit for mounting to a mounting location, comprising:

a substantially planar back panel having two opposite edges;

two substantially planar side panels each having a first edge connected to said back panel and a second edge opposite said first edge and a third edge extending between said first and second edges, said side panels being disposed generally parallel to one another and perpendicular to said back panel;

mounting pins extending from said second edges of said two side panels and from said third edges of said two side panels; and said back panel and said side panels and said mounting pins being formed from a single sheet of thermally conductive material.

9. A circuit board assembly, comprising:

an auxiliary circuit board having mounted thereon circuit elements and having a connector edge, said auxiliary circuit board having a major surface defining a back;

a plurality of electrical connector pins mounted extending from said connector edge;

a case having:

a first planar portion mounted to said back of said auxiliary circuit board, said first planar portion being generally rectangular and having first and second sides disposed generally perpendicular to said connector edge of said auxiliary circuit board, a second planar portion extending generally perpendicular to said first planar portion from said first side of said first planar portion, and a third planar portion extending generally perpendicular to said first planar portion from said second side of said first planar portion; and support tabs extending from at least one edge of each of said second planar portion and said third planar portion, said case and said support tabs being formed from a single sheet of thermally conductive material so as be integrally connected.

10. A case for an auxiliary circuit for mounting to a mounting location, comprising:

a substantially planar back panel having two opposite edge;

two substantially planar side panels each having a first edge connected to said back panel and a second edge opposite said first edge and a third edge extending between said first and second edges, said side panels being disposed generally parallel to one another and perpendicular to said back panel;

support tabs extending from said second edges of said two side panels and from said third edges of said two side panels; and said back panel and said side panels and said support tabs pins being formed from a single sheet of thermally conductive material.

* * * * *